US008653833B2

(12) United States Patent
Chodavarapu et al.

(10) Patent No.: US 8,653,833 B2
(45) Date of Patent: Feb. 18, 2014

(54) SELF CALIBRATING HIGH THROUGHPUT INTEGRATED IMPEDANCE SPECTROMETER FOR BIOLOGICAL APPLICATIONS

(75) Inventors: Vamsy Chodavarapu, Montreal (CA); Mark Trifiro, Montreal (CA)

(73) Assignee: The Royal Institution for the Advancement of Learning / McGill University, Montreal (CA)

( * ) Notice: Subject to any disclaimer, the term of this patent is extended or adjusted under 35 U.S.C. 154(b) by 608 days.

(21) Appl. No.: 12/950,286

(22) Filed: Nov. 19, 2010

(65) Prior Publication Data

US 2011/0115499 A1   May 19, 2011

Related U.S. Application Data

(60) Provisional application No. 61/262,577, filed on Nov. 19, 2009.

(51) Int. Cl.
*G01R 27/28*   (2006.01)
*G01R 27/02*   (2006.01)

(52) U.S. Cl.
CPC .................................... *G01R 27/02* (2013.01)
USPC ...................................................... 324/649

(58) Field of Classification Search
None
See application file for complete search history.

(56) References Cited

U.S. PATENT DOCUMENTS

| 4,661,767 | A  | * | 4/1987  | Sharrit et al. | 324/638 |
| 4,771,792 | A  | * | 9/1988  | Seale | 600/587 |
| 5,485,084 | A  | * | 1/1996  | Duncan et al. | 324/225 |
| 6,501,278 | B1 | * | 12/2002 | Arabi | 324/533 |
| 7,098,670 | B2 | * | 8/2006  | Cole | 324/615 |
| 8,035,409 | B2 | * | 10/2011 | Deutsch et al. | 324/763.01 |
| 8,400,168 | B2 | * | 3/2013  | Troxler et al. | 324/663 |

* cited by examiner

*Primary Examiner* — Paresh Patel
(74) *Attorney, Agent, or Firm* — The Law Office of Michael E. Kondoudis

(57) ABSTRACT

Advances in a variety of fields such as micromachined silicon in conjunction with MEMS and other devices and attaching biosensors to electrode structures have allowed discrete or continuous monitoring devices to be implemented for biological systems, chemical processes, environmental monitoring etc. However, such devices are typically analysed within controlled laboratory environments due to bulky and large electrochemical impedance measurement systems. In many situations deployment in field, clinic, point-of-care, or consumer scenarios would be beneficial. Accordingly it an intention of the invention to provide a measurement system which offers potential for low cost implementations via multiple technologies to address the different cost targets of these applications as well as number of measurement cells within each. Additionally embodiments of the invention are self-calibrating and self-referencing allowing their use in such scenarios absent highly trained technicians.

20 Claims, 12 Drawing Sheets

210

220

PRIOR ART

SELF CALIBRATING HIGH THROUGHPUT INTEGRATED IMPEDANCE SPECTROMETER FOR BIOLOGICAL APPLICATIONS

CROSS-REFERENCE TO RELATED APPLICATIONS

This patent application claims the benefit of U.S. Provisional Patent Application 61/262,577 entitled "Self Calibrating High Throughput Integrated Impedance Spectrometer for Biological Applications", filed Nov. 19, 2009.

FIELD OF THE INVENTION

This invention relates to providing impedance spectrometers, and more particularly to providing impedance spectrometers which have high throughput, offer potential for low cost and are self-calibrating.

BACKGROUND OF THE INVENTION

Since the invention of microtechnology for realizing integrated semiconductor structures for microelectronic chips in the 1950s, these lithography-based technologies have been applied to a wide variety of applications ranging from entertainment (for example gaming consoles, MP3 players etc), through consumer electronics (digital cameras, personal computers, personal data assistants (PDAs) etc), to advanced avionics and telecommunications. Bolstered in the 1960s by generally CMOS compatible micrometer or sub-micrometer sized mechanical structures, known commonly as Micro Electro Mechanical Systems (MEMS), such integrated semiconductor structures have allowed for pressure sensors, airbag sensors, tunable capacitors, inductors and resonators, pivotable mirrors, switches, valves, pumps as well as other mechanically movable structures to become common elements of many consumer and high volume applications.

Concurrently such advances in integrated semiconductor devices also triggered advances in printed circuit boards as interconnections and assemblies became denser, faster, three-dimensional, wire-bondable, solder reflow compatible, and addressed heat management. Accordingly synthetic resin bonded paper materials such as FR-2 were replaced with UV stabilized tetrafunctional epoxy resins, such as FR-4, and ceramics, e.g. aluminum oxide and aluminum nitride, co-fired ceramic green sheets, ceramic packages with copper tungsten inserts etc. Advances were also made in exploiting silicon and semiconductor materials in the microwave domains as well as the photonic domain.

By appropriate combinations of these technologies engineers and material scientists developed solutions to begin replacing bulky, expensive discrete test, evaluation and measurement structures with compact, low cost, replacements that could put tens, hundreds, even thousands of measurand sites within the same footprint. With the advent of fluid based micro-treatments for analysis of biological specimens (so-called μTAS) such systems became feasible for detecting and characterising samples, exploiting techniques such as capillary electrophoresis, chromatographic separation, DNA microarrays, and physiochemical changes of proteins. Coincident requirements for testing within biological and biochemical applications such as within the environmental and pollution monitoring, chemical analysis, medical diagnostics and cellomics, together with synthetic chemistry applications involving rapid screening and microreactors for pharmaceutics have also established demand for low cost measurement solutions and high numbers of measurements to be made rapidly.

Also driving these developments has been the potential to fabricate test arrays for these diverse applications within a silicon platform, which in different forms such as native silicon, micro- and macro-porous silicon, and nitrocellulose-coated variants offers potential for low cost manufacturing by leveraging existing high volume semiconductor manufacturing techniques, high biocompatibility allowing prolonged use rather than discrete measurements, and potential integration of microfluidics, sensors, characterization and analysis elements within circuits integrating CMOS electronics. Even within less advanced applications the advances in printed circuits, ceramic substrates, etc allow for low cost arrays to be provided with tens, hundreds to thousands of test sites.

Amongst the benefits of these different manufacturing approaches are:
  ability to characterise samples with low fluid volumes which means less waste, lower reagents costs and less required sample volumes for diagnostics;
  faster analysis and response times due to short diffusion distances, fast heating, high surface to volume ratios, small heat capacities, etc;
  better process control because of a faster response of the system, e.g. thermal control for exothermic chemical reactions;
  compactness of the systems due to integration of much functionality and small volumes;
  massive parallelization due to compactness, which allows high-throughput analysis and multiple analysis processes within a single integrated circuit;
  lower fabrication costs, allowing cost-effective disposable chips, fabricated in mass production, and wide-spread deployment;
  safer platform for chemical, radioactive or biological studies because of integration of functionality, smaller fluid volumes and stored energies.

When considering any system intended to measure, characterise, analyse or evaluate a particular attribute then the system would normally be considered to be composed essentially of two parts, the transducer which generates a variation in an electrical characteristic in dependence of the measurand, and the measurement electronics which receive and convert the transducer output to a measured value for the measurand. This electrical characteristic may for example be resistance but it is more likely to be a variation in inductance, capacitance, resonant frequency of an oscillator, etc either in isolation or in conjunction with others including resistance. However, in some applications such as bio sensors then the system is best considered to be comprised of three parts:
  the sensitive biological element, which may be biological material, e.g. tissue, microorganisms, organelles, cell receptors, enzymes, antibodies, nucleic acids, etc, or a biologically derived material or biomimic, wherein the sensitive elements can be created by biological engineering;
  the transducer or the detector element, which works in a physicochemical way; optical, piezoelectric, electrochemical, etc., that transforms the signal resulting from the interaction of the analyte with the biological element into another signal (i.e., transducers) that can be more easily measured and quantified; and
  the associated electronics or signal processors that are primarily responsible for the display of the results in a user-friendly way.

As noted supra typically the transducers will present a variation in impedance rather than a simple change in resistance to the electronics and signal processors, and as such the effective electrical circuits these transducers present will have energy storage and dissipation properties which will vary with applied frequency of a probe electrical signal, i.e. their AC properties. Accordingly over the past few years the approach of electrochemical impedance spectroscopy (EIS), also referred to as dielectric spectroscopy or impedance spectroscopy, has grown tremendously and is deployed in a wide variety of scientific fields such as fuel cell testing, biomolecular interaction, micro structural characterization, and electrochemical systems. EIS measures the impedance of a system over a range of frequencies allowing variations in the real and imaginary components to be determined as well as variations in the phase relationship of the output signal with respect to the input excitation signal. Additionally, EIS reveals information about reaction mechanisms within electrochemical processes as different reaction steps will dominate at certain frequencies, and the analysis of the frequency response obtained by EIS can help identify these processes as well as determine rate limiting steps.

However, an issue with EIS systems, and the electronics/signal processors within analysis systems generally is that systems which either perform multiple measurements for a single measurand in order to obtain position dependent information or perform analysis of multiple measurands for multiple samples or even single measurands on multiple samples is the third critical element, the associated electronics. For example, each transducer or detector element there is required an associated analog-to-digital converter (ADC) to convert the analog output of the transducer or detector element to a digital representation that can be read by subsequent digital processing circuitry or microprocessor to provide the result of the measurement made using the transducer or detector element. This requirement is exacerbated further when considering deployment of such analysis systems in environments other than as laboratory test equipment in that resolution of the measurement is determined by the number of bits of the ADC, and typically ADCs with a large number of bits are expensive devices. Equally, fast ADCs allowing the measurements to be made dynamically are similarly expensive devices.

However, in many instances the voltage levels required by ADCs are of the order of a few volts which may affect the biosensor and thereby affect the measurement itself. As a result electrochemical impedance measurements typically require that the voltages applied to the biosensor be of order 5 millivolts (5 mV) to 50 millivolts (50 mV) and may vary in frequency, for example over a range of 1 milliHertz (0.001 Hz or 1 mHz) to 1 MegaHertz (1 MHz), according to the measurement being performed and the sensor employed.

Unfortunately at present like high resolution, fast ADCs systems with low signal levels are typically very expensive as well as being large, heavy laboratory based instrumentation. In many instances these are developed around a frequency response analyser (FRA), such as those shown for example in FIG. 1 including the "Alpha-A" high performance modular measurement system 110 from Novocontrol, "Reference 600" Potentiometer/Galvanometer FRA 120 from Gamry Instruments, "LEIS370" Localized Electrochemical Impedance System 130 from Princeton Applied Research, "1255A Frequency Response Analyser" 140 from Solartron Analytical, "Model 3120" FRA 150 from Venable Instruments, "Model 2505" FRA 160 from Clarke-Hess Communications Research, and the "RA Series 01" FRA 170 and "SA Series 01" modular FRA 180 from Core Technology Group.

Referring to FIG. 2 there are shown commercial EIS systems targeted to biotechnology applications, these being "ECIS Z" 210 from Applied Biophysics and the "96X" series analyzer 220 from ACEA Biosciences. Hence, it is evident that whilst semiconductor manufacturing processes and biochemical processes can provide low cost assay elements, ranging from implantable glucose monitoring structures through to very large disposable assay trays the benefits of EIS at present are limited to environments to such as laboratories, medical clinics, etc where the deployment of such large, expensive systems can be justified or permits their use. Additionally such systems typical present significant limitations in their use through the requirements for calibration.

Hence, it would therefore be beneficial to provide a compact, fast (i.e. high-throughput) EIS electrochemical impedance spectrometry system (FSCEISS) that is self-calibrating. It would be further beneficial if the FSCEISS was implementable with electronics and software/firmware that supported implementations in multiple technologies. For example, it would be beneficial if ultimately the FSCEISS could be implemented as a single monolithic integrated circuit to fully leverage CMOS silicon electronics for very high volume low cost applications such as blood glucose monitoring for diabetics and/or insulin dosage control for type 1 diabetics. The World Health Organization projects that the number of diabetics requiring regular periodic monitoring will exceed 350 million by 2030 and of these up to 50 million will be Type 1 diabetics requiring continuous closed loop delivery systems to control their insulin levels.

Alternatively, in other applications, such as medical clinics, environmental monitoring stations, biochemical monitoring etc it would be beneficial for the FSCEISS to be manufactured leveraging for example with hybrid electronic integration using multi-chip modules (MCMs) or packaged integrated circuits with PCB assembly techniques. Such an FSCEISS thereby allows for an implementation to be tailored to the cost—volume—performance tradeoffs of the particular application.

Another aspect of EIS measurements systems is the excitation signal, which as noted supra may for example be within the range 1 milliHertz (0.001 Hz or 1 mHz) to 100 kilohertz and have an amplitude between 5 mV to 50 mV. Providing a source covering 8 orders of magnitude in frequency and low stable output voltage is another challenging aspect for electronics, suited generally to the large, laboratory style instruments described supra in respect of FIGS. 1 and 2. Commercial synthesizers or digital-to-analog converters (DACs) such as Analog Devices AD766 16 bit 390 kS/s DAC operating at ±3V are capable of achieving such output amplitudes although with a resolution of 0.05 mV at the lowest range limit this signal is generated with the equivalent of a 6-bit ADC. Accordingly the excitation signal is not a high purity single frequency. It would therefore be beneficial to provide a method of analysis that accounted for an imperfect excitation signal.

It is accordingly an intention of this invention to provide a high throughput self-calibrating electrochemical impedance spectroscopy measurement system (FSCEISS) that is compatible with a variety of measurement environments by providing low footprint, high speed, broad frequency response, and an ability to operate with a significant number of measurement sites, the significant number of measurement sites representing measurements that are either spatially distributed and/or multiple biochemical species.

It is also an intention of the invention for such high throughput self-calibrating electrochemical impedance spectroscopy measurement systems to be implementable in a manner that is low cost and permits implementation in different electronic format, ranging from monolithic integration, hybrid integration, through to discretes according to the market dynamics the FSCEISS addresses and provides self-calibration allowing long term use associated with a single user or within environments such as medical clinics where appropriate equipments and expertise is not available.

SUMMARY OF THE INVENTION

It is an object of the present invention to obviate or mitigate at least one disadvantage of the prior art.

In accordance with an embodiment of the invention there is provided a method comprising:
(a) providing a signal generator, the signal generator for generating a probe signal having at least one predetermined characteristic and comprising at least a digital to analog converter;
(b) providing a signal converter, the signal converter for generating a digital representation of at least one analog input signal of a plurality of analog input signals and comprising at least one of an analog to digital converter and a multiplexer;
(c) providing a sensor, the sensor comprising at least a first electrical contact and a second electrical contact;
(d) providing a reference impedance;
(e) applying the probe signal at least one of continuously and selectively to at least one of the first electrical contact of the sensor and the reference impedance;
(f) providing an impedance connect circuit, the impedance connect circuit comprising at least a switch for selectively connecting at least one of the second electrical contact of the sensor and the reference impedance to the signal converter;
(g) providing an analysis circuit, the analysis circuit for receiving at least a digital representation of the generated probe signal and a digital representation of the at least one analog input signal, performing a first process upon the digital representation of the generated probe signal to determine at least a characteristic of the probe signal, performing a second process upon the digital representation of the at least one analog input signal in dependence upon at least the determined characteristic of the probe signal to generate at least one of a real component and an imaginary component of the digital representation of the at least one analog input signal, applying a correction to at least the imaginary component, and determining an impedance of the sensor in dependence upon at least the reference impedance and the at least one of the real component and the imaginary component of the digital representation of the at least one analog input signal; and
(h) at least one of storing the determined impedance within a first memory, displaying a measurement to a user, the measurement determined in dependence of the determined impedance, and using the determined impedance as a control parameter to a dispensing circuit.

In accordance with another embodiment of the invention there is provided a method comprising:
(i) receiving a digital representation of a probe signal, the probe signal being one applied to a test structure of a plurality of test structures, each test structure comprising at least a contact;
(ii) performing a first process upon the digital representation of the probe signal to determine at least a characteristic of the probe signal;
(iii) receiving a digital representation of a test measurement, the test measurement being determined in dependence upon at least the probe signal and the one test structure of the plurality of test structures; and (iv) performing a second process upon the digital representation of the measurement in dependence upon at least the determined characteristic of the probe signal to generate at least one of a real component and an imaginary component of the digital representation of the measurement; and
(v) storing within a memory the at least one of a real component and an imaginary component of the digital representation of the measurement.

In accordance with another embodiment of the invention there is provided a system comprising:
(a) a signal generator, the signal generator for generating a probe signal having at least one predetermined characteristic and comprising at least a digital to analog converter;
(b) a signal converter, the signal converter for generating a digital representation of at least one analog input signal of a plurality of analog input signals and comprising at least one of an analog to digital converter and a multiplexer;
(c) a sensor, the sensor comprising at least a first electrical contact and a second electrical contact;
(d) a reference impedance;
(e) a switch, the switch for receiving the probe signal from the signal generator and applying the probe signal at least one of continuously and selectively to at least one of the first electrical contact of the sensor and the reference impedance;
(f) an impedance connect circuit, the impedance connect circuit comprising at least a switch for selectively connecting at least one of the second electrical contact of the sensor and the reference impedance to the signal converter;
(g) an analysis circuit, the analysis circuit for receiving at least a digital representation of the generated probe signal and a digital representation of the at least one analog input signal, performing a first process upon the digital representation of the generated probe signal to determine at least a characteristic of the probe signal, performing a second process upon the digital representation of the at least one analog input signal in dependence upon at least the determined characteristic of the probe signal to generate at least one of a real component and an imaginary component of the digital representation of the at least one analog input signal, applying a correction to at least the imaginary component, and determining an impedance of the sensor in dependence upon at least the reference impedance and the at least one of the real component and the imaginary component of the digital representation of the at least one analog input signal; and
(h) a first memory, the first memory for storing the determined impedance for subsequent retrieval.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to providing an impedance measurement system that provides time and frequency domain analysis of the impedance measured from a biosensor array for example. The present invention being directed to providing such an impedance measurement system as an integrated circuit allowing for volume manufacturing at low cost.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Figure 1:
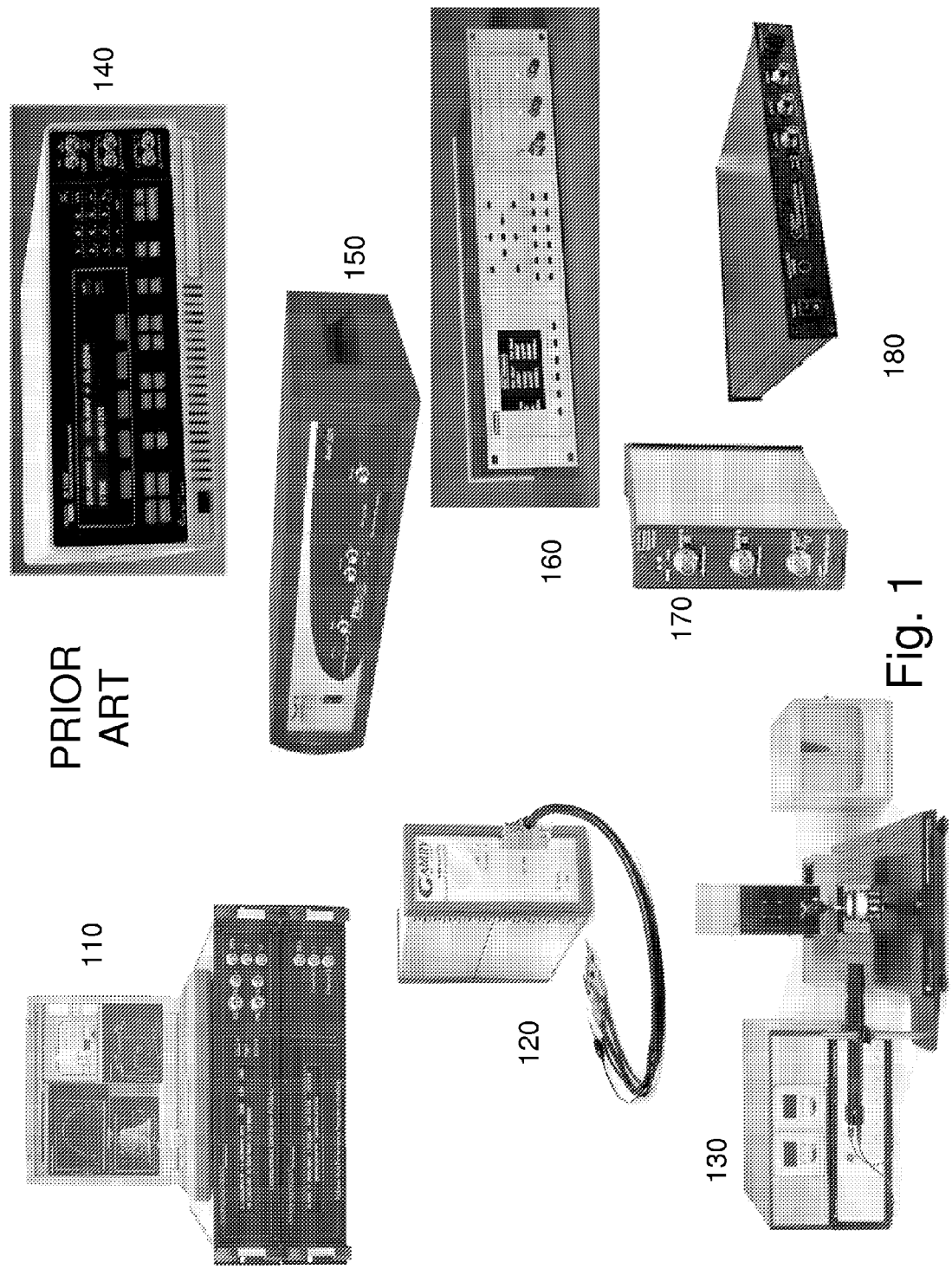
FIG. 1 displays a selection of commercial frequency response analyzers employed in current EIS systems.
Figure 2:
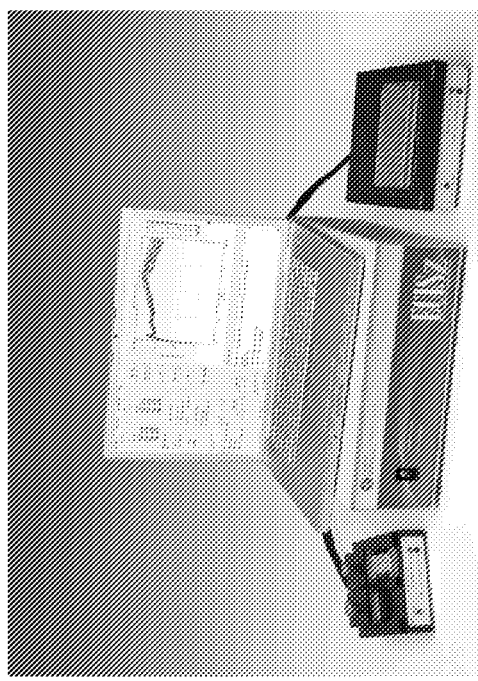
FIG. 2 depicts two currently available commercial EIS systems targeted at biochemical applications.
Figure 2:
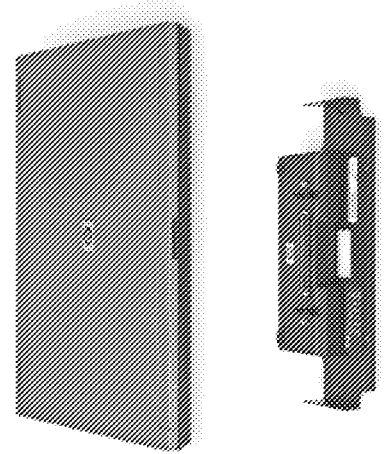

As discussed supra in respect of FIGS. 1 and 2 current commercial FRA and EIS systems are bulky, expensive instruments targeted at laboratory style applications and not directed to providing analysis in a variety of environments ranging from medical clinics, consumer environments, environmental, etc where cost, calibration, etc present different requirements to controlled laboratories. Further, such systems become extremely slow when working with very large numbers of measurement sites as the single FRA/EIS system cycles through them. For example, the "ECIS Z" 210 series instrument shown in FIG. 2 currently retails for approximately US$16,000 for applications. Similarly the "96X" series analyzer 220 in FIG. 2 comprising a W200 RT-CES® analyzer, 96X E-plate® station and RT-CES® SP software from ACEA Biosciences currently retails for approximately US$40,000 for a system to characterize 96 measurement sites.

It would be evident that a shift in manufacturing methodology is required to address the diverse range of non-laboratory centric markets such as continuous personal monitors, portable diagnostic equipment, environmental sensors, etc. Impedance spectrometers according to embodiments of the invention leverage the volume and cost manufacturing advantages of silicon integrated circuits such that the existing systems retailing for tens of thousands of dollars may be replaced with monolithic and hybrid solutions costing a couple of orders of magnitude less. With appropriate design and manufacturing/process engineering then for systems of reduced complexity, i.e. number of biosensors, accuracy of ADC, complexity of DDS core etc, such impedance measurement circuits may be even lower cost particularly in those addressing consumer type applications where volumes fully leverage semiconductor manufacturing.

Figure 3A:
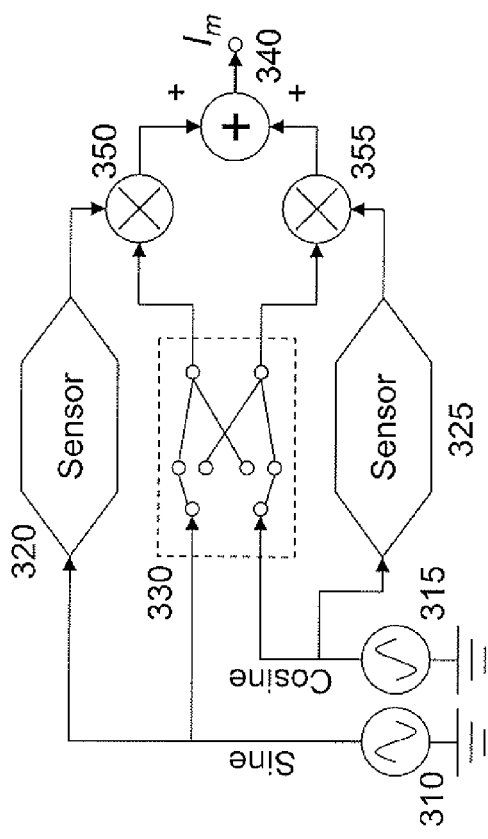
FIGS. 3A and 3B depict a prior art circuit design for implementing a frequency response analyzer within a silicon IC.
Figure 3B:
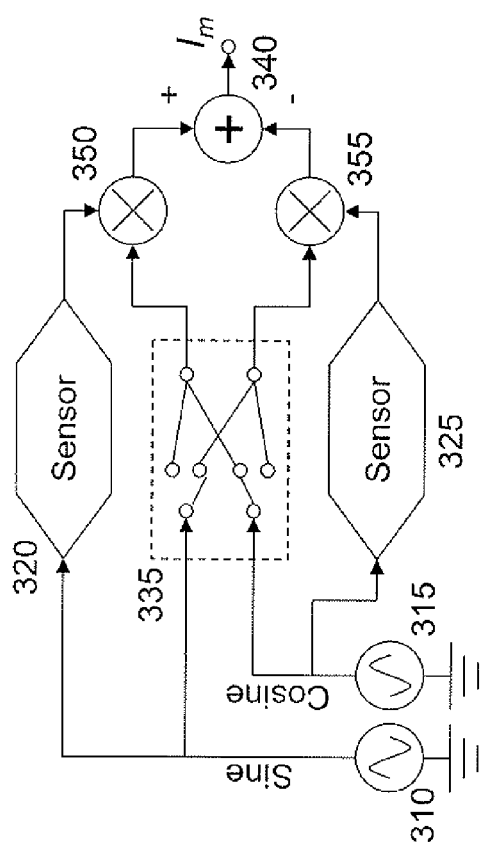

One approach within the prior art to addressing cost reduction is shown in FIGS. 3A and 3B wherein a frequency response analyzer (FRA) building block is outlined which is compatible with silicon microelectronics in respect of the measurement of sensors. The FRA approach being reported by D. Rairigh et al in "Analysis of On-Chip Impedance Methodologies for Sensor Arrays" (Sensor Letters, Vol. 4, pp. 398-402). Within FIG. 3A the FRA approach is shown in a first configuration wherein a first oscillator 310 is electrically coupled to a first sensor 320 and a first port of a switch matrix 330. A second oscillator 315 is electrically coupled to a second sensor 325 and a second port of the switch matrix 330. The output of the first sensor 320 is coupled to a first mixer 350 along with the reference output from the first oscillator 310 via the switch matrix 330. Similarly the output of the second sensor 325 is coupled to a second mixer 355 along with the reference output of the second oscillator 315 via the switch matrix 330. The outputs from the mixers are combined within a summation circuit 340.

In the second configuration shown in FIG. 3B the switch matrix 330 has been switched such that the oscillator outputs are switched in respect of the mixers to which they are coupled. In this manner the approach of Rairigh requires two identical sensors, namely first and second sensors 320 and 325, responding to dual phase excitation signals, from the first and second oscillators 310 and 315 respectively, in a way that inherently extracts DC values and removes AC interference. The real and imaginary components can be directly computed in sequence, the configurations shown in FIGS. 3A and 3B respectively, using this single configurable hardware block that redirects the multiplier inputs and implements either a signal summation or a signal subtraction, depending on which of the complex impedance components is being resolved.

Because the output of this rapid FRA system is independent of excitation signal frequency, the computation time is constant and the system can process the entire spectrum rapidly. If we assume a 20 ms worst-case time of the rapid FRA system depicted in FIGS. 3A and 3B to compute a result at each stimulus frequency, a pixel of the sensor array can be measured over a frequency range from 1 Hz to 10 kHz with logarithmic sampling at 30 points/decade in 2.4 sec. However, a drawback of the Rairigh FRA cell is that for every measurement two identical sensor cells must be provided as well providing two mixers and a summation circuit. This requirement impacts cost directly in requiring additional complexity and double the number of cells but also through yield as non-identical cells impact performance. Additionally the extracted DC real and imaginary components must still be converted with an ADC.

For Electrochemical Impedance Spectroscopy (EIS), it is necessary to make precise measurements of AC signals which are buried in either noise or large background signals. One technique for such measurements is that employing Lock-in Amplifier techniques which eliminate undesired noise or background signals by acting as a narrow band-pass filters, which are "locked-in" through receiving the reference signal frequency (excitation signal) and perform a modified fast Fourier transform on the input signal at this reference signal frequency. In order to perform precise lock-in measurements simultaneous-sampling of multiple channels that each have one analog to digital converter per channel can be used. In addition, the inputs should be designed such that they have small phase-mismatch. The data analysis system of the invention, of which an embodiment will be described with respect to FIGS. 4B through 10 respectively below, can also be programmed as a Lock-in-Amplifier system as presented in FIG. 4A.

Figure 4A:
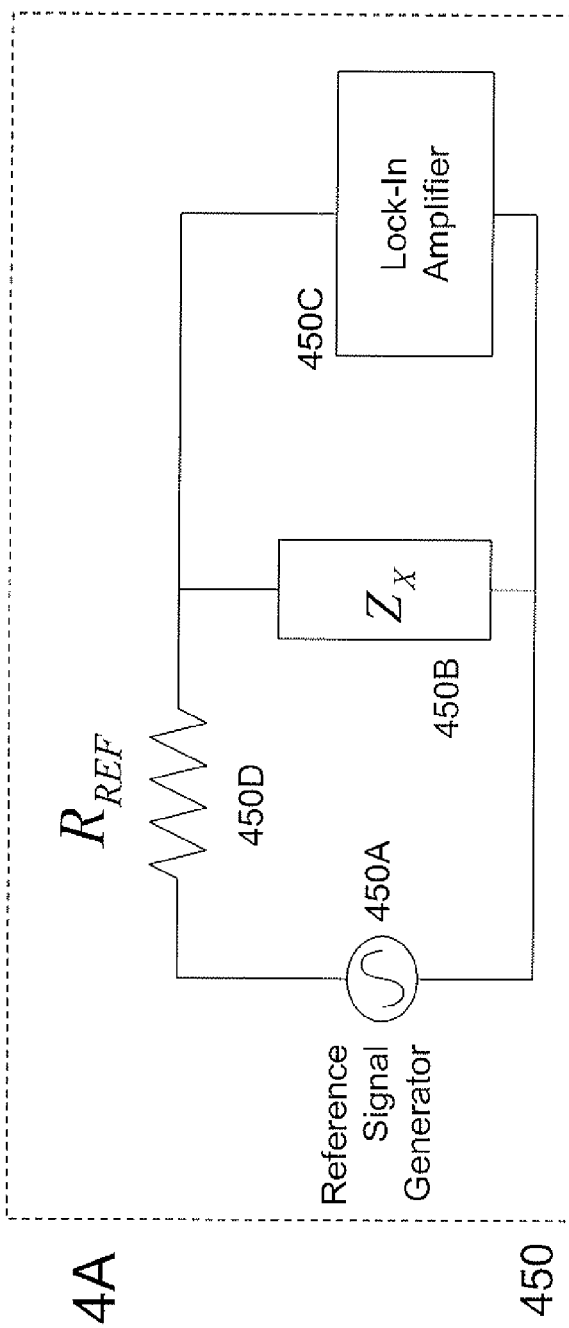
FIGS. 4A and 4B depict schematics of an FSCEISS measurement system in context of a lock-in amplifier technique and according to an embodiment of the invention.

Within FIG. 4A the data analysis system 450 is shown as comprising a reference signal generator 450A which is coupled across the unknown resistance $Z_X$ 450B via a series reference resistor $R_{REF}$ 450D. The Lock-in Amplifier 450C is connected so that it measures the signal developed across the unknown resistance $Z_X$ 450B. The data analysis system 450 thereby generates an AC signal with reference signal generator 450A and applies it through the series reference resistor $R_{REF}$ 450D to the test sample with the unknown impedance $Z_X$ 450B. For a series reference resistor $R_{REF}$ 450D of 1 MΩ this generates an approximate constant current of 1 μA flowing through the unknown impedance $Z_X$ 450B. The Lock-in Amplifier 450C measures the amplitude and phase of the signal developed across the unknown impedance $Z_X$ 450B which is then used to calculate the unknown impedance value $Z_X$. The value of the series reference resistor $R_{REF}$ 450D may be fixed or variable according to the particular data analysis system implemented and have a value or range of values to provide appropriate constant currents to the sensors comprising unknown impedance $Z_X$ 450B. It would be evident to one skilled in the art that the use of a variable series reference resistor $R_{REF}$ 450D also allows for the constant current to be varied within an array of sensors according to sensor geometry, operating principle, etc.

Figure 4B:
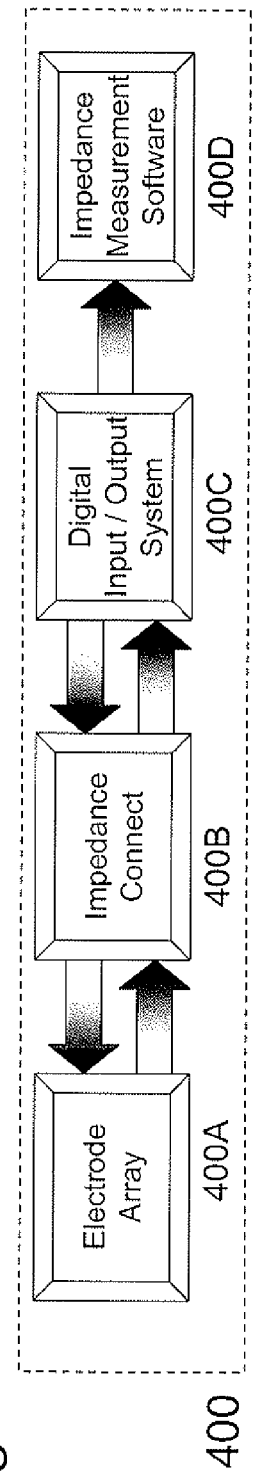

Referring to FIG. 4B there is depicted a block diagram schematic of a fast, i.e. high-throughput, self-calibrating electrochemical impedance spectrometry system (FSCEISS) 400 according to an embodiment of the invention. As shown the FSCEISS 400 comprises four elements, the first being electrode array 400A which contains the sensor elements, e.g. a biosensor, and communicates bi-directionally with a second element, an impedance connect circuit 400B. The impedance connect circuit 400B is then bi-directionally connected to the third element, namely the digital input/output system (DIOS) 400C, wherein the output of the DIOS 400C is provided to the fourth element, software 400D. The software 400D converts the digitally converted impedance result obtained for each element in the electrode array 400A to a measurement.

Figure 5A:
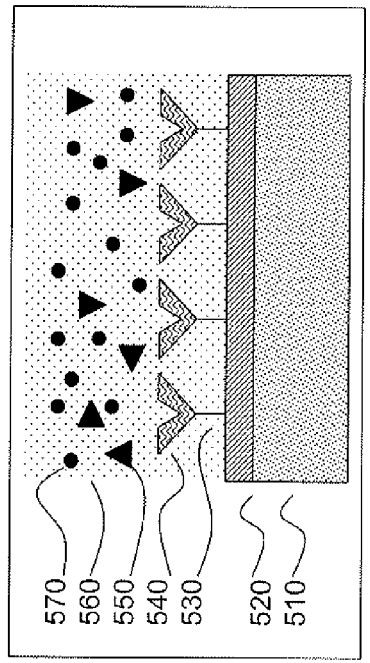
FIGS. 5A through 5D depict an exemplary application for embodiments of the invention wherein measurement electrodes are provided by glucose compatible biosensors.

FIGS. 5A through 5D depict an exemplary application for embodiments of the invention wherein a biochemical measurement is performed using measurement electrodes that include glucose compatible biosensors. As shown in FIG. 5A the electrode array 400A is shown as comprising a two-dimensional array of electrode elements 580. Within the embodiments of the invention as described below with respect to FIGS. 6 through 10 one possible embodiment for the electrode array 400A is based upon the physiochemical changes of proteins wherein the protein is bound to an electrode, part of the electrode element 580, and the physiochemical change occurs when the protein traps the target molecule. The electrode array 400A can be implemented in multiple technologies ranging from those with very small footprints using semiconductor CMOS processing techniques for example so that it may be implanted in the body or it can be embedded in a needle penetrated under the skin for point-of-care purposes in a hospital for example, through to printed circuit boards (PCBs), screen printed ceramics, etc which offer varying footprint, cost, performance, tradeoffs as well as resistances to chemicals etc.

It would be apparent to one skilled in the art that many alternate approaches may be employed to provide an electrode structure that has an impedance that varies in dependence upon an aspect of the environment surrounding the electrode structure, including but not limited to physical effects, such as pressure, temperature, humidity, etc, chemical effects, such as gas composition, liquid composition, gas partial pressure, liquid ion concentration, etc, and biochemical effects.

Figure 5B:
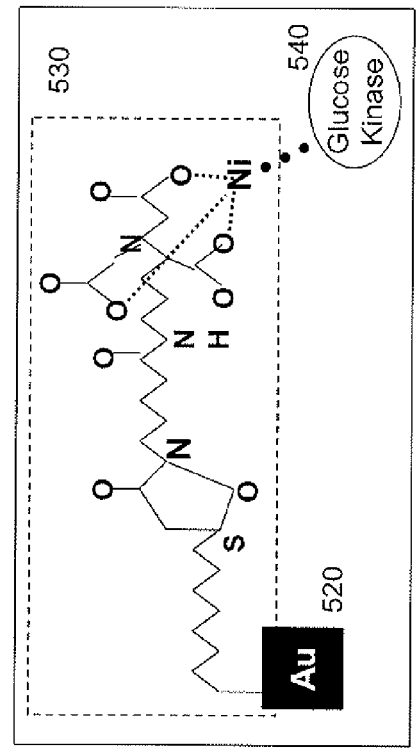
Figure 5C:
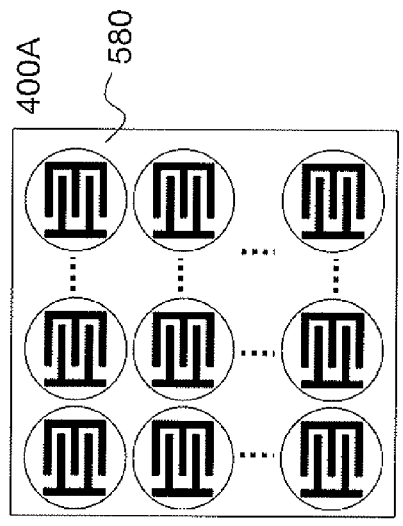
Figure 5D:
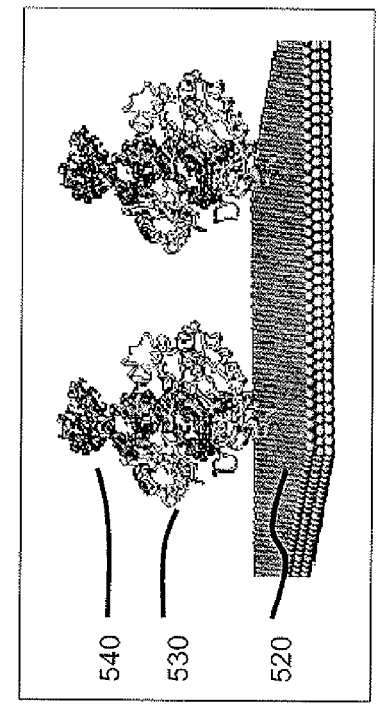

Referring to FIG. 5A each electrode element 580 of electrode array 400A comprises an interdigitated gold electrode which possesses a high affinity for proteins, thereby making them very suitable for several bioelectrochemical applications. According to one embodiment as shown in FIG. 5B the interdigitated electrodes 520 are formed from a gold layer deposited by a sputtering process upon a silicon substrate 510. An adhesion layer (not shown for clarity), for example of titanium and of thickness approximately 20 nm, may be deposited before the gold layer, of thickness 200 nm for example, and which is subsequently patterned using a photolithography process.

Next, the protein 540 should be connected to the surface of interdigitated electrodes 520 through a linker 530 as shown in FIG. 5B. The electrode element 580 when exposed to an aqueous medium 560 for example, human blood for example, sees a variety of molecules 570, such as white blood cells, red blood cells and cholesterol, as well as glucose 550. Due to the three-dimensional structure of the protein 540, which in this exemplary embodiment the protein is glucokinase (GLK), as in FIG. 5C together with the linker 530, the GLK will only bind with the glucose 550 wherein it will undergo a physiochemical change which results in a change in impedance for the electrode 580. Accordingly, the more glucose 550 present within the aqueous medium 560 then the higher the amount of glucose 550 that will bind with the protein 540 (GLK) and the greater the change in impedance.

Several biochemical procedures are performed in this exemplary embodiment to create the linker 530 between the protein 540, being GLK macro molecules, and the gold interdigitated electrodes 520. In one possible process, four different steps including a self-assembly monolayer (SAM), melamine, nickel and glucose are performed to create the required linker 530 The chemical structure of the linker 530 being shown in FIG. 5D between the interdigitated electrodes 520 and protein 540 (GLK). Accordingly the electrode element 580 within this exemplary embodiment acts to bind glucose and provides a measurand therefrom, namely the impedance of the interdigitated electrodes, which varies in dependence upon the concentration of said glucose in the aqueous medium 560.

Figure 6:
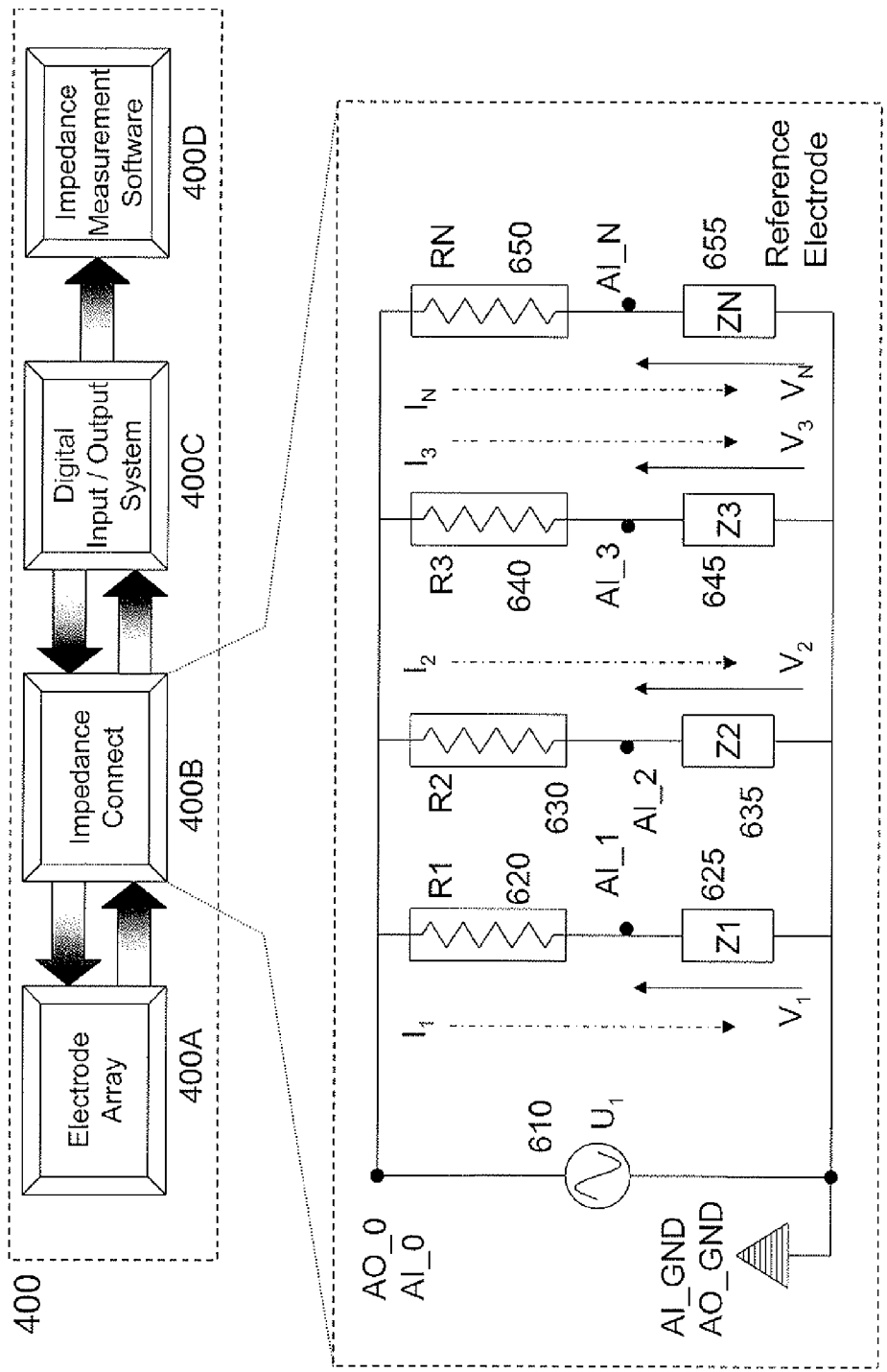
FIG. 6 depicts an approach to self-calibration of an FSCEISS measurement system according to an embodiment of the invention.

FIG. 6 depicts an approach to impedance measurement and self-calibration for an FSCEISS 400 measurement system according to an embodiment of the invention. Shown is a schematic of exemplary impedance connect 600, being one potential embodiment for the impedance connect circuit 400B of the FSCEISS 400. As shown, a voltage source 610 of potential $U_1$ is connected to a plurality, N, of parallel electrical circuits. The first electrical circuit comprising first resistor 620 of resistance $R_1$ and first variable impedance 625 of impedance $Z_1$, the second electrical circuit comprising second resistor 630 of resistance $R_2$ and second variable impedance 635 of impedance $Z_2$, and the third electrical circuit comprising third resistor 640 of resistance $R_3$ and third variable impedance 645 of impedance $Z_3$. This continues until the $N^{th}$ electrical circuit comprising $N^{th}$ resistor 650 of resistance $R_N$ and $N^{th}$ variable impedance 655 of impedance $Z_N$. As a result of the potential $U_1$ from voltage source 610 each electrical circuit has an electrical current flowing, these being $I_1$, $I_2$, $I_3$, ..., $I_N$ respectively. As a result, potentials $V_1$, $V_2$, $V_3$, ..., $V_N$ are developed across each of the first to $N^{th}$ variable impedances 625 through 655 respectively.

Impedance describes the total opposition of a circuit to a sinusoidal alternating current (AC), such as potential $U_1$ from voltage source. It describes the relative amplitudes and phases of the voltage and current, is measured in ohms, and may include a resistance (R), an inductive element ($X_L$) and a capacitive reactance ($X_C$). Accordingly an impedance measurement is based on I-V method where an unknown impedance, e.g. $N^{th}$ variable impedance $Z_N$, is calculated using Ohm's law from the voltage and current values and is given by equation (1) below:

$$Z_x = \frac{\overline{V}_1}{\overline{I}} \quad (1)$$

where $\overline{V}_1$ is the voltage across the unknown impedance $Z_x$ and $\overline{I}$ is the current flowing. Current is calculated using the voltage drop measurements across an accurately known reference resistor $R_{ref}$. The $R_{ref}$ voltage drop is calculated by taking the difference of single-ended voltages on $R_{ref}$. The unknown impedance $Z_x$ can be obtained from equation (2) below:

$$Z_x = \frac{R_{ref} * \overline{V}_1}{\overline{V}_2 - \overline{V}_1} \quad (2)$$

where $\overline{V}_1$, $\overline{V}_2$, and $Z_x$ are complex variables.

The measurement of unknown impedance $Z_x$ using the I-V method requires a signal generator, i.e. voltage source 610, to generate a sinusoidal signal (input) $\overline{V}_1$ of known amplitude, frequency and phase and a signal acquisition system, not shown for clarity, to measure the resulting signal (output) $\overline{V}_2$ across the unknown impedance $Z_x$. Such commercial signal acquisition systems in the prior art being typified by those presented supra in respect of FIGS. 1 and 2.

As discussed supra in respect of FIG. 4 the impedance connect 400B is connected to the digital input/output system (DIOS) 400C of the FSCEISS 400. With respect to exemplary impedance connect 600 of FIG. 6 then an analog output channel AO_0 is coupled from the DIOS 400C to generate the desired excitation signal, whilst an analog input channel AI_0 monitors this generated excitation signal. Analog input channels AI_1 through AI_N are connected to the corresponding working electrodes of the first to $N^{th}$ variable impedances 625 through 655 respectively which form part of electrode array 400A. Each analog input channel AI_1 through AI_N acquires the resultant voltage signal across its respective variable impedance. A reference electrode of the electrode array 400A may be shorted to analog input ground, AI_GND, and analog output ground, AO_GND, and may formed within the electrode structure of the electrode layer, and may for example replace the $N^{th}$ variable impedance $Z_N$.

It would be apparent from FIG. 6 supra that the exemplary impedance connect 600 consists of an analog input channel AI_x for each element, such as electrode element 580, within the electrode array 400A. Accordingly the number of analog input channels can become quite significant even for relatively small electrode arrays 400A, e.g. N=32, N=64 require 32 and 64 analog channels to be coupled through to the DIOS 400C. Accordingly it would be beneficial in some instances to provide a multiplexed interconnection of the electrode array 400A to the DIOS 400C for a FSCEISS 400 according to an embodiment of the invention.

Figure 7:
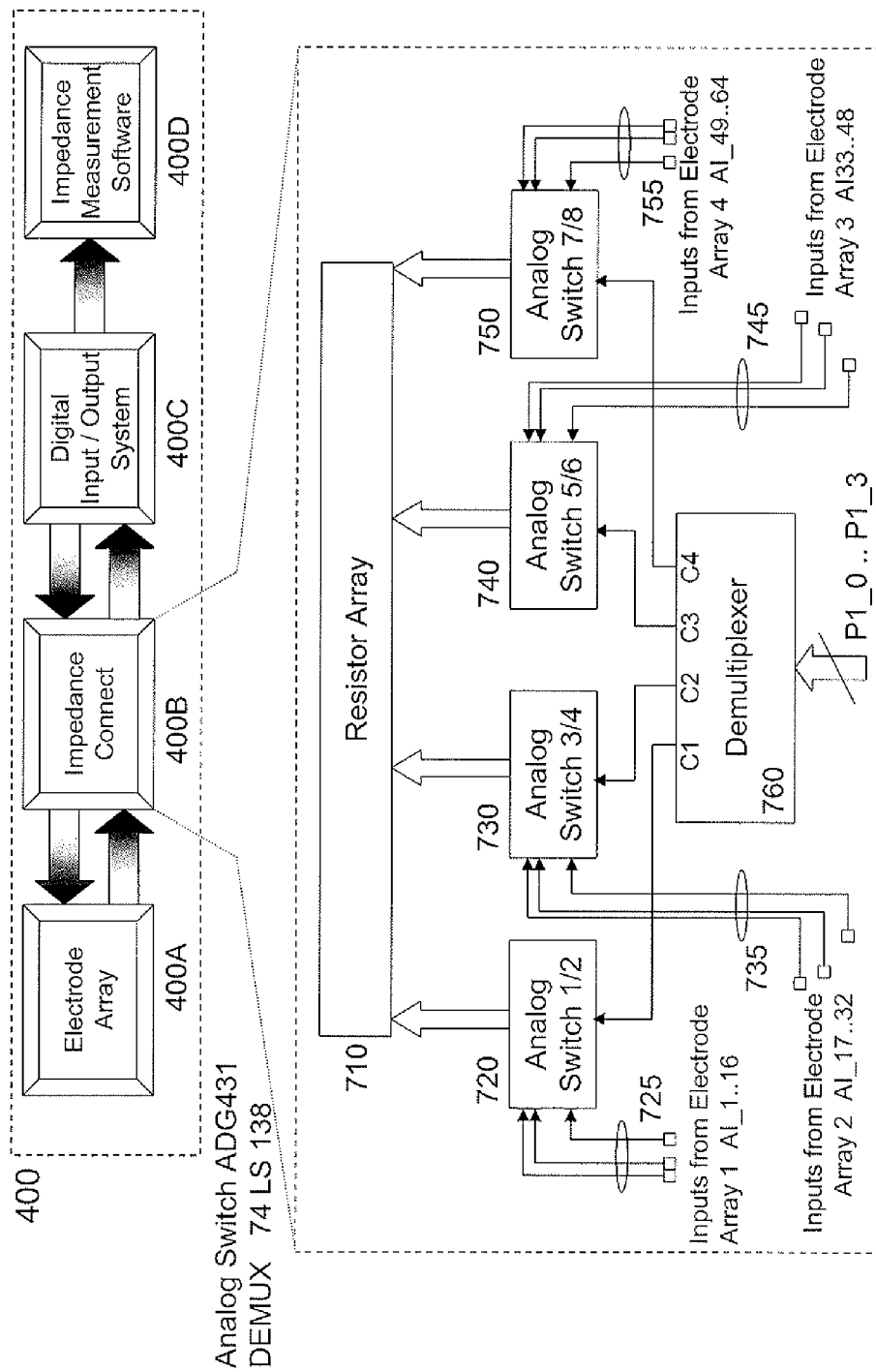
FIG. 7 depicts multiplexed interconnection of arrayed measurement sites for an EIS measurement system according to an embodiment of the invention.

One such multiplexing configuration is presented in FIG. 7 by multiplexed impedance connect 700. As shown a resistor array 710, which represents, for example, first through $N^{th}$ resistors 610 to 650 respectively, is connected to first to fourth analog switches 720 through 750, such as for example those manufactured by Maxim Integrated Products Inc. (Maxim) and Analog Devices Inc. (Analog Devices) who offer integrated circuits offering Single Pole Single Throw (SPST) switches in quad and octal configurations. These are then connected to a demultiplexer 760, such as for example offered by Motorola, Maxim and Analog Devices who offer 4:1, 8:1 and 16:1 decoder/demultiplexer circuits, which have control inputs P1_0, ..., P1_3 coupled to the demultiplexer 760 from the DIOS 400C. First analog switch 720 receives control signal C1 from demultiplexer 760 and receives inputs AI_1, AI_2, ..., AI_16 from a first electrode array, not shown for clarity. Second analog switch 720 receives control signal C2 from demultiplexer 760 and receives inputs AI_17, AI_18, ..., AI_32 from a second electrode array, not shown for clarity. Similarly third and fourth analog switches 730 and 740 receive control signals C3 and C4 respectively from the demultiplexer 760 and input analog signals from channels AI_33, AI_34, ..., AI_48 and AI_49, AI_50, ..., AI_64 respectively.

In this manner multiplexed impedance connect 700 can address an electrode array 400A of order 256 electrode elements with a DIOS 400C that receives only 16 analog inputs when fully expanded using multiplexed impedance connect 700. FIG. 7 depicts a partially populated embodiment with only 4 electrode arrays rather than the potential 16. It would be evident that other embodiments using different combinations of analog inputs, analog switches and multiplexing may be employed according to the application being addressed. For example, a $2^N$ multiplexer of order N=6 with 16 input lines can address 1024 elements. Alternatively 4096 measurement elements may be testing using a $2^N$ multiplexer of order N=8 and 16 input lines to the multiplexer or with an 8:1 multiplexer addressing 8 input lines for a $2^N$ multiplexer of order N=9. Accordingly it would be evident to one skilled in the art that combinations are possible wherein the large number of measurement sites are switched and multiplexed to the multiplexer with a portioning between switching and multiplexing that is determined in respect of issues such as measurement speed, cost, footprint etc. Further whilst discussions in respect of the embodiments presented within FIGS. 6 through 11 are made in respect of a single multiplexer it would be apparent also that architectures using two or more stages of multiplexing are possible, thereby reducing switching requirements, or that multiple multiplexers may be employed together with a subsequent switching stage and/or multiple processors executing the control and analysis software, i.e. IMS 400D.

It would be obvious to one skilled in the art that the analog output and analog output monitoring signals, AO_0 and AI_0 respectively, may also be switched to the corresponding electrode array. Control of the demultiplexer 760 from the DIOS 400C may be implemented using the control inputs P1_0, ..., P1_3 according to the scheme presented below in respect of Table 1 for example.

TABLE 1

Exemplary Control Scheme from DIOS 400C to Demultiplexer 760

| | X for P1_X | | | |
|---|---|---|---|---|
| Array | 0 | 1 | 2 | 3 |
| 1 | 0 | 0 | 0 | 0 |
| 2 | 1 | 0 | 0 | 0 |
| 3 | 0 | 1 | 0 | 0 |
| 4 | 1 | 1 | 0 | 0 |
| 5 | 0 | 0 | 1 | 0 |
| 6 | 1 | 0 | 1 | 0 |
| 7 | 0 | 1 | 1 | 0 |
| 8 | 1 | 1 | 1 | 0 |
| 9 | 0 | 0 | 0 | 1 |
| 10 | 1 | 0 | 0 | 1 |
| 11 | 0 | 1 | 0 | 1 |
| 12 | 1 | 1 | 0 | 1 |
| 13 | 0 | 0 | 1 | 1 |
| 14 | 1 | 0 | 1 | 1 |
| 15 | 0 | 1 | 1 | 1 |
| 16 | 1 | 1 | 1 | 1 |

Figure 8A:
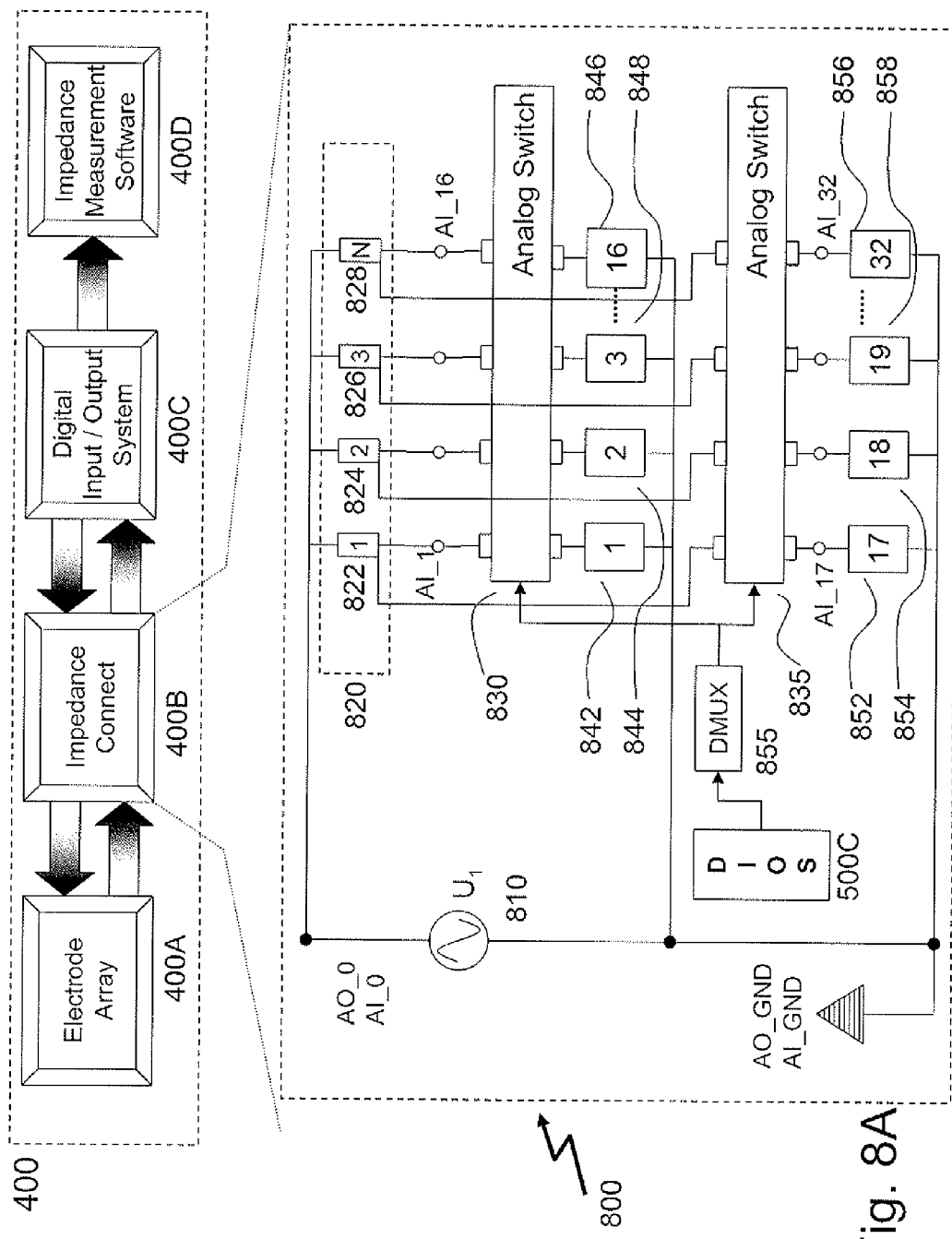
FIGS. 8A and 8B depict an embodiment of the invention exhibiting the multiplexed interconnection and measurement of arrays of measurement sites.

Referring to FIG. 8A there is depicted an exemplary multiplexed impedance connect 800, being an electrical schematic of portion of the multiplexed impedance connect 700 of FIG. 7 supra. Accordingly there is shown resistor array 820 comprising first, second, third through to $N^{th}$ resistors 822 to 828 respectively. One end of these are connected to the analog output signal AO_0 from the DIOS 400C whilst the other ends are connected to first analog switch 830 and second analog switch 835. The first analog switch 830 therefore selectively connects the resistor array 820 to the first, second, third and sixteenth variable impedances 842, 844, 846 and 848 respectively which are grounded to analog output and input grounds AO_GND and AI_GND respectively. Similarly second analog switch 835 selectively connects the resistor array 820 to the seventeenth, eighteenth, nineteenth and thirty second variable impedances 852, 854, 856 and 858 respectively which are similarly grounded to analog output and input grounds AO_GND and AI_GND respectively. The voltage source 810 provides AC signal $U_1$ across the resistors and selected electrodes via AO_0 and AO_GND respectively.

Control signals to the first and second analog switches 830 and 835 respectively are provided from the DMUX 855, such as demultiplexer 760 of FIG. 7, which is controlled from the DIOS 400C. Accordingly by appropriate control the analog switches, such as first and second analog switches 830 and 835, respectively connect the sub-set arrays of variable impedances, such as biochemical sensors described supra in respect of FIGS. 5A through 5D, to the voltage source 810 in conjunction with the resistor array 820. Self-calibration may be achieved by replacing one or more predetermined variable impedances within the arrays with a fixed reference resistance or impedance such as described supra in respect of FIG. 6.

Figure 8B:
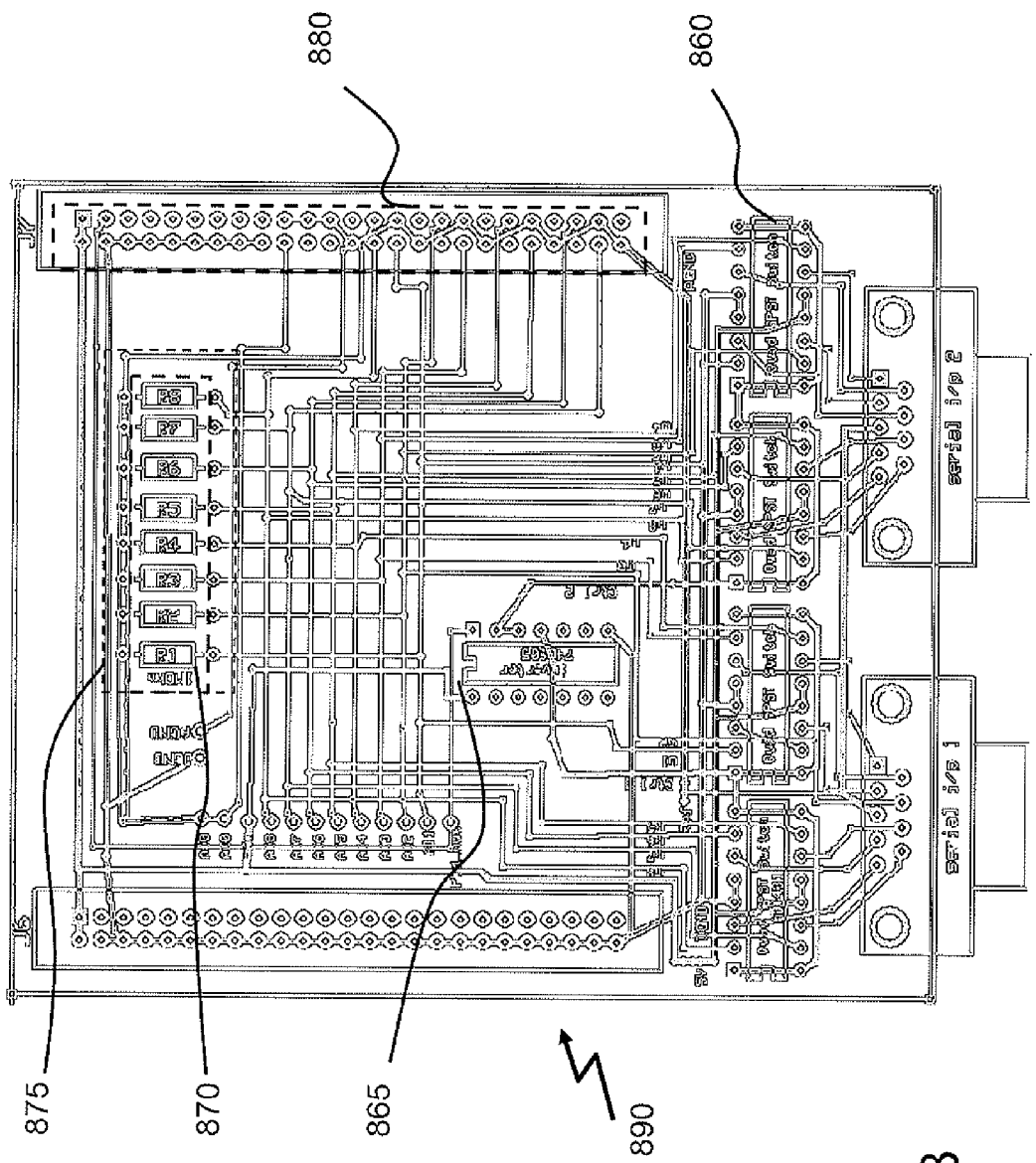

Now referring to FIG. 8B there is shown a printed circuit board (PCB) 890 indicating how the impedance connect 400B can be implemented with relative simplicity using a low cost manufacturing technique. As shown the PCB 890 comprises four analog switch circuits 860, such as for example those provided by Analog Devices and Maxim as Quad Single Pole Single Throw (SPST) circuits referred to in FIG. 7 supra, together with an inverter 865, such as provided by Analog Devices, to interconnect multiple Quad SPST switch circuits. Also shown are the resistor positions 870 forming the resistor array 875, for example resistor array 820 in FIG. 8A, and the interconnection arrays 880 to connect the impedance connector 400B to the electrode array 400A. PCB 890 therefore being formed for example from low cost PCB materials such as FR-2 and FR-4 and standard CMOS integrated circuits.

Figure 9:
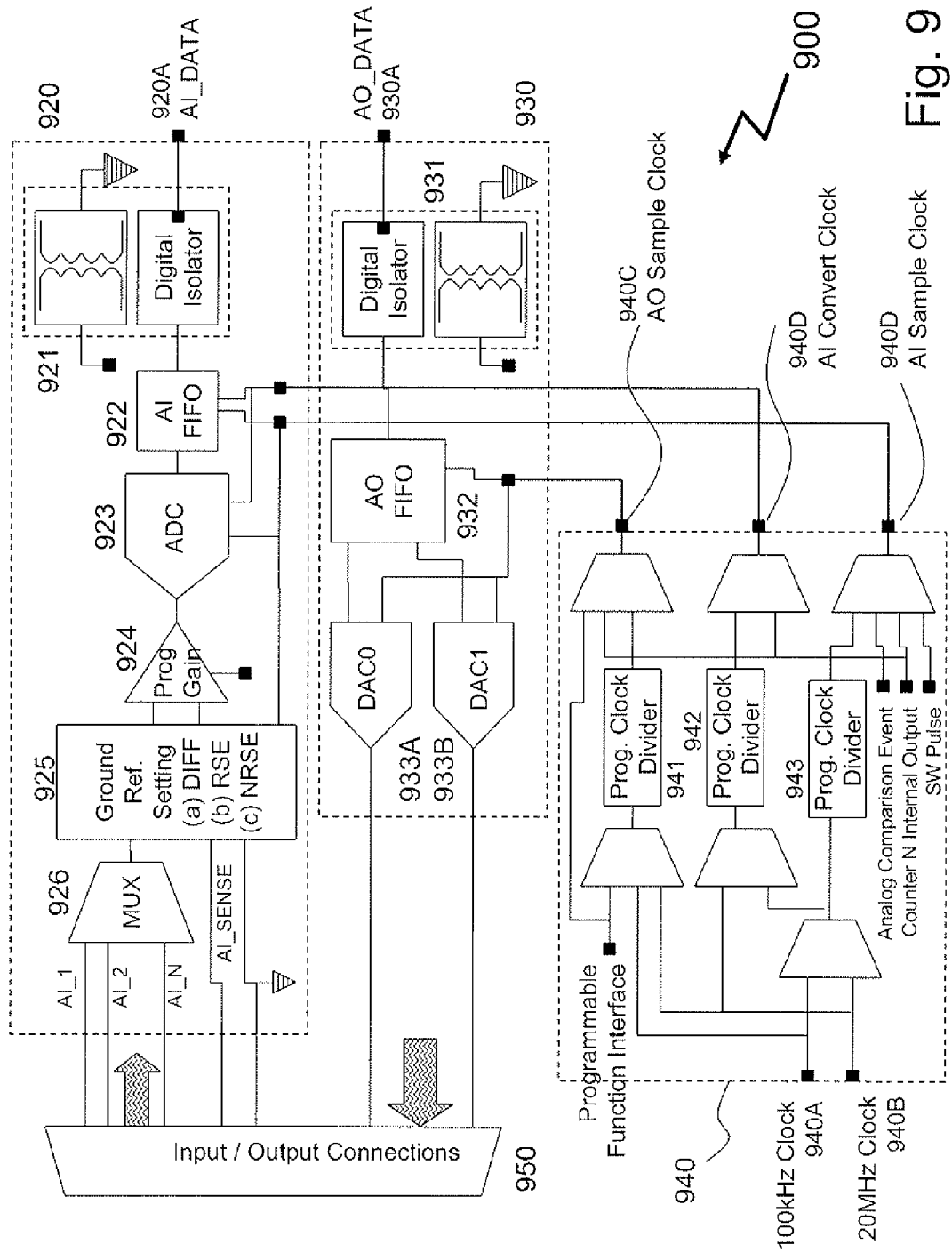
FIG. 9 depicts a programmable excitation circuit and measurement circuit for the EIS system according to an embodiment of the invention.

Referring to FIG. 9 there is depicted an exemplary embodiment of a programmable excitation circuit and measurement circuit (PECMC) 900 for a FSCEISS 400. As such the PECMC 900 forms a potential embodiment for the DIOS 400C. The PECMC 900 comprises an analog input section 920, an analog output section 930 and a clock circuit 940. Considering firstly the clock circuit 940 then this receives a first clock at first port 940A and a second clock at second port 940B. These are employed by clock circuit 940 in conjunction with first, second, and third programmable clock dividers 941 through 943 respectively to generate an analog output sample clock provided from third port 940C, an analog input convert clock from fourth port 940D, and analog input sample clock from fifth port 940E.

The analog output sample clock is coupled from third port 940C to analog output FIFO 932, first DAC 933A and second DAC 933B within the output circuit 930. Each of the first and second DACs 933A and 933B respectively also receive an output from the analog output FIFO 932. The input to the analog output FIFO 932 is coupled from the AO_DATA port 930A of the output circuit 930 via digital isolator circuit 931. The outputs from the first and second digital-to-analog converters (DACs) 933A and 933B respectively being coupled to an input/output connection block 950, being AO_0 and AO_1, for example.

The analog input convert clock and analog input sample clock are coupled from the fourth and fifth ports 940D and 940E respectively to an analog input FIFO 922 and analog-to-digital converter (ADC) 922 of the input circuit 920. The output of ADC 922 is also coupled to the analog input FIFO 922, and a ground reference setting circuit 925. The output of the analog input FIFO 922 is coupled to the AI_DATA port 920A via digital isolator 921. The ADC 922 is further coupled to, and receives a signal to be converted, from programmable gain stage 924 which receives its inputs from ground reference setting circuit 925, and are generated in dependence of the signal received from the multiplexer (MUX) 926 in conjunction with AI_SENSE and ground signals received from the input/output connection block 950. MUX 926 similarly receives signals from the input/output connection block 950, these being the N signals to be measured on lines AI_1, . . . , AI_N.

Accordingly analog output section 930 provides the AC excitation signal, equivalent to voltage source 810 for example in FIG. 8, to the impedance connect 400B and thereupon to the electrode array 400A. The electrode array measurements within electrode array 400A by the impedance connect 400B, such as AI_1, . . . , AI_N discussed supra in respect of FIG. 6 for example, are coupled therefore to the lines AI_1, . . . , AI_N from the input/output connection block 950 and therein to the MUX 926. Accordingly these lines are sampled and converted within the analog input section 920 as determined under the clocks generated by the clock section 940. The sampled and converted signals are then provided to the AI_DATA port 920A from the analog input section 920. In this manner the PECMC 900 acts as the DIOS 400C of the FSCEISS 400.

It would be apparent to one skilled in the art that the analog input section 920 and analog output section 930 are both synchronized to the same master clocks, being the first and second clocks provided to first and second ports 940A and 940B respectively of clock circuit 940. According to one potential embodiment the first clock being 100 kHz and the second clock being 20 MHz and the DIOS 400C, as presented by PECMC 900, may provide AO_0 and AO_1 as 16-bit 250 kS/s analog output channels with an amplitude of ±3V using Analog Devices ADG766 16 bit 390 kS/s DACs for first and second DACs respectively. The frequency of the analog output channels, implementing the analog source 810 for example, being determined by the maximum sample clock rate of the second clock provided to the clock section 940 of the PECMC 900 and the desired number of samples per each cycle. Additionally the phase of these signals is set to be zero. The waveform for each of the analog output channels, such as AO_0, is generated based upon the parameters such as amplitude, offset, frequency, phase, number of samples per buffer and number of cycles per buffer, the data being buffered for example in memory associated with the DIOS 400C and not shown for clarity in the preceding figures.

To efficiently generate the excitation signal and to ensure that memory buffers do not overflow, the samples per channel may be limited to say 4096 and/or the number of samples per buffer may be programmed such that for low frequencies the number of samples is more and for high frequencies number of samples is less. The waveform parameters such as frequency along with the number of samples per buffer and number of signal cycles per buffer determine other parameters given by equations (3) and (4) below:

$$Clk_{Desired} = \frac{f * S_{buffer}}{C_{buffer}} \quad (3)$$

$$S_{cycle} = \frac{S_{buffer}}{C_{buffer}} \quad (4)$$

where $Clk_{Desired}$ is the desired sample clock rate, f is the frequency of the excitation signal, $S_{buffer}$ is the samples per memory buffer, $C_{buffer}$ is the cycles per memory buffer, and $S_{cycle}$ is the number of samples per cycle.

Similarly, DIOS 400C as presented by PECMC 900, may be implemented with a sampling of 16 bits for each AI_x analog channel with a sampling rate of 250 kS/s using a low cost commercial ADC circuit, for example those provided by Analog Devices. Maxim, National Semiconductor and Linear Technology using Successive Approximation Register (SAR) ADC and Pipelined ADC architectures according to speed, accuracy, cost, and power requirements. As PECMC 900 within the exemplary embodiment of FIG. 9 supra employs a single ADC with a multiplexer to lower overall costs there is a propagation delay between the two input channels, AI_0 which relates to the applied signal, and AI_x which relates to the $x^{th}$ analog input line. This propagation delay results in an additional phase offset between the signals which can adversely affect the AC analysis of the signals and therefore needs to be compensated for. This requires recognizing that the propagation delay that has been introduced is determined by the sampling rate of the device and then calculating the expected phase offset due to the propagation delay at the required frequency is given by equation (5) below:

$$\Phi_{offset} = (R_{sample} * f) * 360 \quad (5)$$

where $\Phi_{offset}$ is the measurement induced phase offset, $R_{ref}$ is the sampling rate of the device, and f is the frequency of the excitation signal.

After this input multiplexing and ADC conversion the digital isolated signal is provided at the output of the analog input section 920 as AI_DATA, whereupon it is provided to the final stage of the FSCEISS 400, namely the impedance measurement software (IMS) 400D. Within the IMS 400D this sampled, digitized analog signal representative of the impedance of the electrode being measured is converted to an impedance measurement. An example of the software control provided by the IMS 400D is presented in FIG. 10 by exemplary process flow 1000.

It would be apparent to one skilled in the art that where the FSCEISS 400 is addressing measurements wherein there is negligible dynamic variation and that whilst the primary concern is speed of measurements other factors such as replacement of assay trays containing measurement sites exist that even 250 kS/s sampling/excitation may be more than sufficient. Alternately in other applications with dynamic monitoring it would be apparent that 250 kS/s may be either over-measuring or under-measuring the measurements sites. Hence it is apparent that alternate implementations of the embodiments of the invention may be possible to address such issues simply by either replacing the first and second DACs 933A and 933B respectively, replacing the ADC 923, or both. Such replacements adjusting the cost of implementation according to whether sampling rates are reduced, for example to 100 kS/s, or whether they are increased to rates of 1 MS/s, 10 MS/s for example. It would be evident further that with multiple sources including for example Maxim, Analog Devices, Linear Technology, National Semiconductor, Fairchild Semiconductor, NEC, Mitsubishi Corporation, Sony, Texas Instruments etc that DACs 933A and 933B need not be supplied by the same supplier as ADC 923. Further in some instances where very high speed analysis may be required, such as in employing FSCEISS 400 in evaluating chemical reactions, catalytic processes etc or biological processes that happen rapidly, sampling rates for the analog-to-digital interfaces may be increased to 100 MS/s or even 1 GS/s. Such flexibility in selection of these analog-to-digital interfaces allows FSCEISS 400 systems to be tailored to the application and cost targets allowing the objective of lowering the cost of EIS systems against current prior art commercial systems by orders of magnitude to be achieved.

In most instances within the range of 100 kS/s to 10 MS/s evaluating supplier options for the FSCEISS 400 has been considered as being implemented with 16-bit accuracy devices for the DAC/ADC cost element of the BoM, resulting in costs well below $50 in most instances. It would also be apparent that in applications where testing is geared to more basic positive/negative determinations that accuracy may in those instances be traded for cost and lower accuracy DAC/ADC elements, e.g. 4-bit, 8-bit, may be employed thereby further reducing the BoM. Equally in some instances increasing accuracy may be beneficial wherein suppliers, albeit with reduced range of products, offer DAC/ADC elements with 24-bit accuracy.

Figure 10:
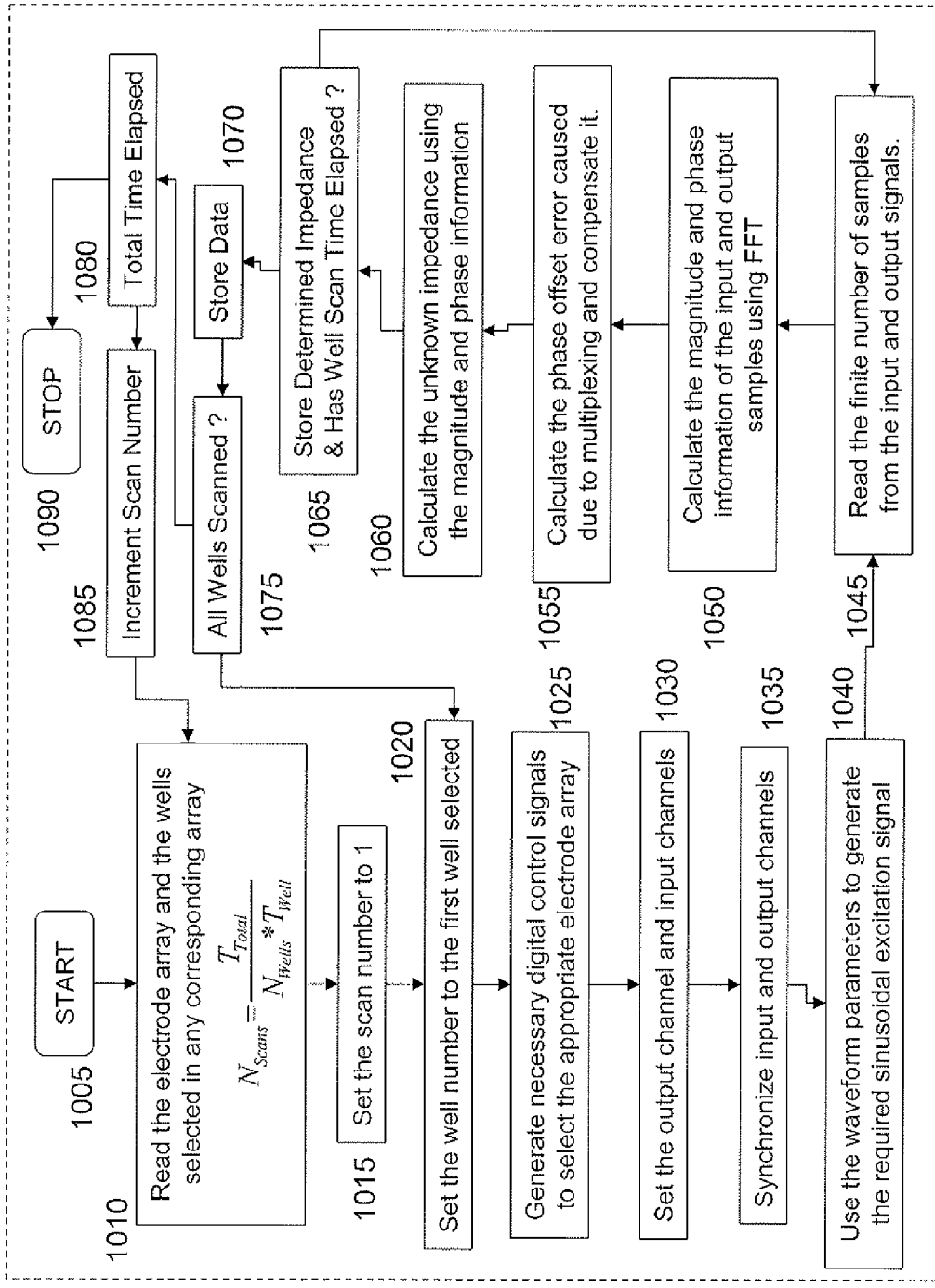
FIG. 10 depicts an exemplary process flow for the EIS system according to an embodiment of the invention.

Referring to FIG. 10 exemplary process flow 1000 begins at step 1005, although prior to this some standard information has been entered into the software, this may include for example selection of the wells, i.e. electrode elements, within the electrode arrays that need to be monitored, entering the sinusoidal waveform parameters (e.g. amplitude, offset, frequency range, number of frequency measurements etc), the total time to execute the program and the time to scan each well, the filename and file path for the storage of the measured data etc. Alternatively a portion of this information may be derived from data stored within a memory associated with the processor/or FSCEISS equipment, such as sinusoidal waveform parameters, time etc and other portions determined automatically such as filename for storage being acquired from a barcode on the assay tray or time/date of the measurements for example.

From step 1005 the process moves to step 1010 and reads the information regarding the electrode array and the electrode elements (i.e. wells) to be measured and from this determines how many scans to perform, as described by equation (6) below:

$$N_{scans} = \frac{t_{total}}{N_{wells} * t_{well}} \quad (6)$$

where $t_{total}$ is the total time allotted for the measurements, $N_{wells}$ is the number of wells to be scanned, and $t_{well}$ is the time of the measurement per well.

The process then moves to step 1015 and sets the scan counter to 1, moves to step 1020 and sets the well number to the first one within the array to be measured. Then in step 1025 the process generates the necessary control signals to provide to the DIOS 400C, for example PECMC 900, and impedance connect 400B, such as multiplexed impedance connect 800. Accordingly in step 1030 the output channel and input channels are established, such as AO_O, AI_0, AI_x. Moving forward to step 1035 the input and output channels are synchronized, for example by using the common the clocks applied from the clock section 940 within PECMC 900. Then in step 1040 the waveform parameters are used to generate the required sinusoidal excitation signal, AO_O, which is then applied to the well under evaluation. Moving forward to step 1045 the finite number of samples defined for the input and output channels are read and transferred from the DIOS 400C to the memory buffers of the processor associated with process flow 1000.

Next in step 1050 this stored data is used to generate the magnitude and phase information of the impedance of the well. According to this embodiment of the invention Fourier transform techniques are employed to determine the amplitude and phase of the acquired waveform, AI_DATA. As such a first Fast Fourier Transform (FFT) is performed on the acquired input signal, AI_0 being representative of the applied signal AO_0 to the measurement sites. The resulting amplitude spectrum is used to determine the peak frequency $f_{peak}$, which is other than DC and in this case is the signal frequency, f, for which the amplitude is a maximum. This first FFT however accounts for the fact that the applied signal frequency, f, has been digitally synthesized and thereby determines the main frequency component of the applied signal.

Next the amplitude spectrum of the output signal, AI_x, is calculated using a second FFT process at the determined peak frequency $f_{peak}$, resulting in the extraction of magnitude and phase information for the acquired waveform, AI_DATA. Moving forward the process moves to step 1055 wherein the phase offset error resulting from the input multiplexing is calculated and applied as a correction to the determined magnitude and phase information.

Next moving to step 1060 this corrected magnitude and phase information for the output signal in conjunction with the extracted input signal information is employed in equation (7) below to calculate the unknown impedance.

$$Z = \frac{R_{ref} * V_{out} \angle \theta_{out}}{V_{in} \angle \theta_{in} - V_{out} \angle \theta_{out}} \quad (7)$$

Moving forward to step 1065 the process checks to determine if the scan time has elapsed and stores the determined impedance. If the scan time has not elapsed then the process moves back to step 1045 and repeats the impedance determination. In this manner multiple measurements may be extracted allowing either temporal or statistical analysis of the impedance. If the scan time has elapsed then the process moves to 1070 and stores all the calculated data, whereupon the process moves to step 1075 and determines if all wells have been scanned. If more wells remain then the process moves back to step 1020 and continues. If all wells have been scanned the process moves forward to step 1080 and determines if the total time of the measurements has elapsed. If the total time has elapsed then the process moves to step 1090 and stops, otherwise the process moves to step 1085 to increment the scan number and moves back to step 1010 to re-start the well measurements from the first well again.

It would be apparent to one skilled in the art that the exemplary process flow 1000 presented above in respect of FIG. 10 considers that the excitation parameters, frequency, amplitude are set for each well being tested. This embodiment therefore allows for wells, i.e. electrode elements, within the electrode array 400A to be configured differently. For example, the electrode array 400A may comprise a first row for glucose, a second row for insulin, a third row for blood acidity, a fourth row for white blood cells, etc. The excitation parameters for these rows may be different. Alternatively the excitation parameters may be common to multiple rows or all rows irrespective of whether multiple measurands are present within the electrode array 400A and hence the parameters are set in dependence of this information within the initial configuration.

It would also be apparent to one skilled in the art that the exemplary process flow 1000 may be implemented to reflect the nature of the measurements being performed. For example, in an embodiment wherein temporal information is of primary importance the process may loop through every cell making a single determination of impedance and then repeating the scanning of all cells. Alternatively only a portion of the cells may be temporally sensitive wherein the process may perform multiple time based measurements of these cells before moving onto other cells where discrete measurements that are not time sensitive may be made. Equally it would be evident that the number of measurements upon each cell may be adjusted within each particular measurement according to statistical requirements of the measurement. Optionally the placement of these cells may be that they are distributed across an assay tray rather than in a single location such that the measurements are initially performed upon cells distributed within the array prior to scanning the remainder of the array.

It would be apparent to one skilled in the art that the above embodiments of the FSCEISS 400 provide potential for low cost implementations that address a requirement for FSCEISS systems to offer a cost reduction of a couple of orders of magnitude when compared to the current prior art systems described in respect of FIGS. 1 and 2. It should also be apparent that the mere reduction of electronics costing is insufficient alone to provide for an effective low cost FSCEISS as it is necessary to address the resulting absence of high purity excitation signals, narrow receiver passband filtering, and mixing circuits present within the prior art commercial systems. This aspect being accounted by the software algorithms which determine the characteristics of the excitation signal as well as the received signal from the measurement cells and the correction for errors induced by the electronic hardware.

In respect of cost reduction, the functions identified within the supra embodiments of FIGS. 6 through 9 have been considered as being provided by integrated circuits which are commercially available in packaged form, such as SOIC from vendors, such as Analog Devices, Maxim, etc. However, in high volume applications such as blood monitoring etc further cost reductions in the BoM may be anticipated arising from shifts in manufacturing from discrete ICs with PCBs to multi-chip modules (MCMs) with bare silicon die allowing implementable FSCEISS systems to address the cost requirements of such consumer orientated applications. Further, very high volume applications may benefit from an application specific integrated circuit which integrates the core silicon elements to a single die thereby leveraging semiconductor manufacturing costs and removing multiple die level packaging and bonding operations etc from the final BoM.

Figure 11:
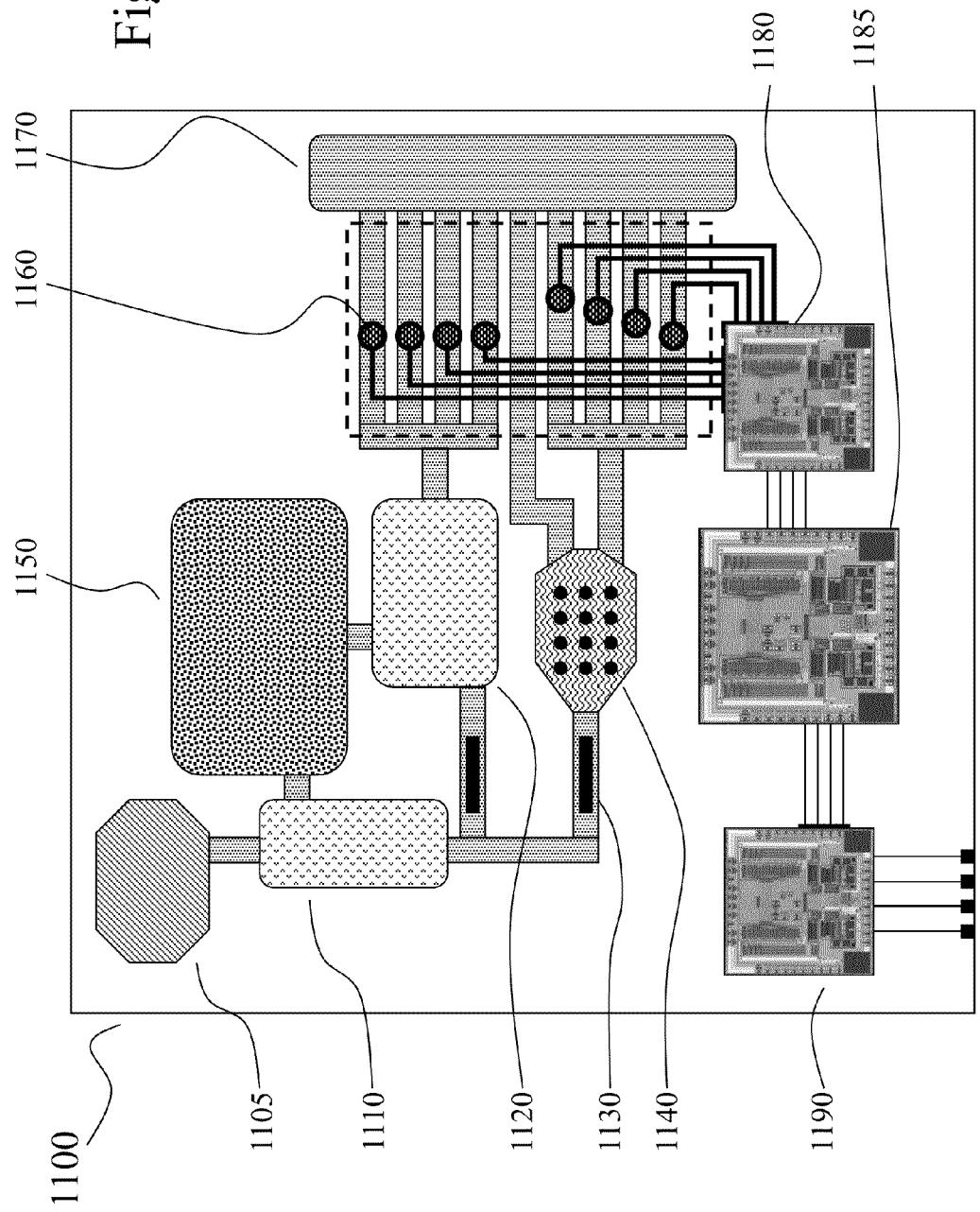
FIG. 11 depicts a multiple measurand LOC employing an EIS measurement system according to an embodiment of the invention.

Referring to FIG. 11 there is depicted a multiple measurand LOC 1100 employing an EIS measurement system according to an embodiment of the invention. The multiple measurand LOC 1100 comprises a sample introduction area 1105 formed within a silicon substrate. The sample introduced into the sample introduction area 1105 is then moved to within a first dilution chamber 1110 which is also interconnected to buffer and anti-coagulant reservoir 1150. The diluted sample is then moved from the first dilution chamber 1110 to a second dilution chamber 1120 and a separator 1140, which for example separates white blood cells from red blood cells. The channels to each of the second dilution chamber 1120 and separator 1140 containing flow sensors 1130. From the second dilution chamber the sample flows into an array of four channels, each containing an electrode sensor 1160, and therefrom to a waste chamber 1170. From the separator the unwanted residue is coupled via a channel to the waste chamber 1170, the filtered blood to be analyzed flowing into an array of four channels each containing an electrode sensor 1160 before being coupled to the waste chamber 1170.

The electrode sensors 1160 are coupled to the impedance connect circuit 1180 which is then coupled to the impedance measurement circuit 1185 and from there to a wireless transmitter 1190 which transmits the measured values to an external device comprising the software (not shown for clarity). As a result the multiple measurand LOC 1100 formed from a small integrated circuit may be implanted into a patient wherein the sample introduction area 1105 and waster chamber 1170 are coupled to blood vessels within the patient. Accordingly the multiple measurand LOC 1100 continuously monitors the patients blood and wirelessly transmits the measurements to a device such as a Personal Digital Assistant (PDA), cell phone or other device to present the results to the patient or transmit them to another computer to the patients, their doctor, or a hospital/clinic. In this manner the multiple measurand LOC 1100 can be implanted within the patient and provide continuous monitoring of the patients blood chemistry.

Alternatively the multiple measurand LOC 1100 may be attached to the skin of the patient and be coupled via capillary tubing to a patient's blood vessel(s). Also it would be evident to one skilled in the art that alternatively the silicon integrated circuit of the LOC which incorporates the electrodes, impedance connect, impedance measurement circuit and wireless transmitter may additionally include a microprocessor and memory allowing the LOC to also perform the conversion of measured impedance to determined result. Optionally the silicon circuit of the LOC may include memory between the impedance measurement circuit and wireless transmitter such that the measurements are stored until the wireless transmitter is within range of its host device or is interrogated to return the measured values thereby removing the requirement for the user to carry the associated device with them at all times.

Whilst the embodiments discussed supra in respect of FIGS. 6 through 11 have been described with respect to the FSCEISS 400 storing the determined impedance data it would be apparent to one skilled in the art that the determined impedance from the measurements of the electrode elements or well may for example be stored in memory for subsequent retrieval and analysis, displayed to a user of the FSCEISS 400 at the time of measurement, be transmitted to another device, or be employed as the input to another device. In the case where the output is displayed to the user then the measured impedance may be further processed such that the displayed value is presented according to a scale the user is familiar with, e.g. milligrammes per deciliter (mg/dl) or millimol (mM or mmol/l) for blood sugar in respect of diabetics.

In the event that the measured impedance is employed as the input to another device it would be apparent to one skilled in the art that the other device may adjust an aspect of a biological or chemical system to achieve a predetermined result. For instance, a CGM device may adjust the dosage of insulin to a user based upon the FSCEISS 400 both continuously monitoring and communicating to a dosage device or the FSCEISS 400 detecting that the measured impedance has exceeded a predetermined threshold to trigger the release of insulin.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method comprising:
    (a) providing a signal generator, the signal generator for generating a probe signal having at least one predetermined characteristic and comprising at least a digital to analog converter;
    (b) providing a signal converter, the signal converter for generating a digital representation of at least one analog input signal of a plurality of analog input signals and comprising at least one of an analog to digital converter and a multiplexer;
    (c) providing a sensor, the sensor comprising at least a first electrical contact and a second electrical contact;
    (d) providing a reference impedance;
    (e) applying the probe signal at least one of continuously and selectively to at least one of the first electrical contact of the sensor and the reference impedance;
    (f) providing an impedance connect circuit, the impedance connect circuit comprising at least a switch for selectively connecting at least one of the second electrical contact of the sensor and the reference impedance to the signal converter;
    (g) providing an analysis circuit, the analysis circuit for receiving at least a digital representation of the generated probe signal and a digital representation of the at least one analog input signal, performing a first process upon the digital representation of the generated probe signal to determine at least a characteristic of the probe signal, performing a second process upon the digital representation of the at least one analog input signal in dependence upon at least the determined characteristic of the probe signal to generate at least one of a real component and an imaginary component of the digital representation of the at least one analog input signal, applying a correction to at least the imaginary component, and determining an impedance of the sensor in dependence upon at least the reference impedance and the at least one of the real component and the imaginary component of the digital representation of the at least one analog input signal; and (h) at least one of storing the determined impedance within a first memory, displaying a measurement to a user, the measurement determined in dependence of the determined impedance, and using the determined impedance as a control parameter to a dispensing circuit.

2. A method according to claim 1 wherein,
providing the signal converter further comprises a second memory for storing at least the digital representation of at least the one analog input signal of the plurality of analog input signals such that steps (g) and (h) are performed subsequently upon the contents of the second memory.

3. A method according to claim 1 further comprising;
(i) providing a wireless transmitter, the wireless transmitter for transmitting at least the digital representation of at least one analog input signal of a plurality of analog input signals to at least one of a second memory for storing and the analysis circuit.

4. A method according to claim 1 wherein,
providing the sensor comprises at least an element of an array of elements, each element having an aspect varying in dependence upon a measurand, said aspect variation resulting in a variation of impedance for the element.

5. A method according to claim 4 wherein,
a first predetermined portion of the array of elements receive the probe signal with the predetermined characteristic at a first value and a second predetermined portion of the array of elements receive the probe signal with the predetermined characteristic at a second value.

6. A method according to claim 1 wherein,
using the determined impedance as a control parameter to a dispensing circuit comprises adjusting an aspect of the dispensing circuit in dependence upon at least one of the real component of the determined impedance, the imaginary component of the determined impedance, and a value determined in dependence upon at least the determined impedance.

7. A method comprising:
(i) receiving a digital representation of a probe signal, the probe signal being one applied to a test structure of a plurality of test structures, each test structure comprising at least a contact;
(ii) performing a first process upon the digital representation of the probe signal to determine at least a characteristic of the probe signal;
(iii) receiving a digital representation of a test measurement, the test measurement being determined in dependence upon at least the probe signal and the one test structure of the plurality of test structures; and
(iv) performing a second process upon the digital representation of the measurement in dependence upon at least the determined characteristic of the probe signal to generate at least one of a real component and an imaginary component of the digital representation of the measurement; and
(v) storing within a memory the at least one of a real component and an imaginary component of the digital representation of the measurement.

8. A method according to claim 7 further comprising:
(vi) determining an impedance of the test structure in dependence upon the at least one of the real component and the imaginary component of the digital representation of the measurement and a reference measurement.

9. A method according to claim 8 wherein;
the reference measurement is a digital representation of the result of applying the probe signal to a reference impedance.

10. A method according to claim 8 further comprising:
(vii) applying a correction to at least one of the real component and the imaginary component of the digital representation of the measurement, the correction determined in dependence upon at least an aspect of acquisition of the digital representation of at least one of the probe signal and test measurement.

11. A method according to claim 8 wherein;
receiving a digital representation of a test measurement comprises at least one of connecting the test structure of the plurality of test structures in series with a predetermined resistance and applying the probe signal and electrically connecting the contact of the plurality of contacts associated with the plurality of test structures to a digital converter.

12. A method according to claim 8 wherein,
the at least a characteristic of the probe signal is a frequency component of a plurality of frequency components of the probe signal.

13. A method according to claim 12 wherein,
the frequency component of the plurality of frequency components of the probe signal is the frequency component of the plurality of frequency components having the highest amplitude and being other than a zero frequency.

14. A method according to claim 8 further comprising:
(vi) determining in dependence upon the stored at least one of the real component and the imaginary component of the digital representation of the measurement at least one of an impedance of the test structure of the plurality of test structures, a characteristic of the environment of the test structure of the plurality of test structures, a value to present to a user, and an action.

15. A method according to claim 14 wherein,
the action comprises setting a parameter of a device to a predetermined value in order to adjust a characteristic of the environment of the test structure of the plurality of test structures.

16. A system comprising:
(a) a signal generator, the signal generator for generating a probe signal having at least one predetermined characteristic and comprising at least a digital to analog converter;
(b) a signal converter, the signal converter for generating a digital representation of at least one analog input signal of a plurality of analog input signals and comprising at least one of an analog to digital converter and a multiplexer;
(c) a sensor, the sensor comprising at least a first electrical contact and a second electrical contact;
(d) a reference impedance;
(e) a switch, the switch for receiving the probe signal from the signal generator and applying the probe signal at least one of continuously and selectively to at least one of the first electrical contact of the sensor and the reference impedance;
(f) an impedance connect circuit, the impedance connect circuit comprising at least a switch for selectively connecting at least one of the second electrical contact of the sensor and the reference impedance to the signal converter;
(g) an analysis circuit, the analysis circuit for receiving at least a digital representation of the generated probe signal and a digital representation of the at least one analog input signal, performing a first process upon the digital representation of the generated probe signal to determine at least a characteristic of the probe signal, performing a second process upon the digital representation of the at least one analog input signal in dependence upon at least the determined characteristic of the probe signal to generate at least one of a real component and an imaginary component of the digital representation of the at least one analog input signal, applying a correction to at least the imaginary component, and determining an impedance of the sensor in dependence upon at least the reference impedance and the at least one of the real component and the imaginary component of the digital representation of the at least one analog input signal; and (h) a first memory, the first memory for storing the determined impedance for subsequent retrieval.

17. A system according to claim 16 wherein,
the signal converter further comprises a second memory for storing at least the digital representation of at least one analog input signal of a plurality of analog input signals.

18. A system according to claim 16 further comprising;
(i) a wireless transmitter, the wireless transmitter for transmitting at least the digital representation of at least one analog input signal of a plurality of analog input signals to at least one of a second memory for storage and the analysis circuit.

19. A system according to claim 16 wherein,
the sensor comprises at least an element of an array of elements, each element having an aspect varying in dependence upon a measurand, said aspect variation resulting in a variation of impedance for the element.

20. A system according to claim 18 wherein,
a first predetermined portion of the array of elements receive the probe signal with the predetermined characteristic at a first value and a second predetermined portion of the array of elements receive the probe signal with the predetermined characteristic at a second value.

* * * * *